United States Patent [19] [11] Patent Number: 5,206,920
Cremer et al. [45] Date of Patent: Apr. 27, 1993

[54] INTEGRATED OPTICAL ARRANGEMENT FOR DEMULTIPLEXING A PLURALITY OF DIFFERENT WAVELENGTH CHANNELS AND THE METHOD OF MANUFACTURE

[75] Inventors: Cornelius Cremer, Pong; Norbert Emeis, Munich; Hans Mahlein, Unterhaching, all of Fed. Rep. of Germany

[73] Assignee: Siemens Aktiengesellschaft, Munich, Fed. Rep. of Germany

[21] Appl. No.: 824,354

[22] Filed: Jan. 23, 1992

[30] Foreign Application Priority Data

Feb. 1, 1991 [DE] Fed. Rep. of Germany ....... 4103095
Feb. 21, 1991 [DE] Fed. Rep. of Germany ....... 4105465

[51] Int. Cl.$^5$ .................. G02B 6/10; H01L 21/70; H04J 1/00
[52] U.S. Cl. ........................... 385/37; 385/14; 385/47; 385/130; 385/132; 437/51; 437/147; 437/148; 359/115; 359/124; 359/130; 359/173
[58] Field of Search ................. 385/14, 47, 37, 129, 385/131, 132, 130, 147; 437/36, 51, 80, 81, 147, 148, 149; 359/115, 123, 124, 173, 130

[56] References Cited

U.S. PATENT DOCUMENTS

| | | | |
|---|---|---|---|
| 4,696,536 | 9/1987 | Albares et al. | 385/14 |
| 4,715,027 | 12/1987 | Mahapatra et al. | 385/14 |
| 4,760,569 | 7/1988 | Mahlein | 385/14 |
| 4,776,661 | 10/1988 | Handa | 385/37 |
| 4,786,133 | 11/1988 | Gidon et al. | 385/37 |
| 4,938,553 | 7/1990 | Maerz et al. | 385/14 |
| 5,064,263 | 11/1991 | Stein | 385/14 |
| 5,077,822 | 12/1991 | Cremer | 385/130 |
| 5,136,671 | 8/1992 | Dragone | 385/46 |

FOREIGN PATENT DOCUMENTS

| | | | |
|---|---|---|---|
| 0275795 | 7/1988 | European Pat. Off. | 385/37 X |
| 0356190 | 2/1990 | European Pat. Off. | 385/14 X |
| 0383138 | 8/1990 | European Pat. Off. | 385/14 X |
| 0393372 | 10/1990 | European Pat. Off. | 385/37 X |
| 4004445 | 8/1991 | Fed. Rep. of Germany | 385/147 X |

OTHER PUBLICATIONS

Charles H. Henry et al., "Four-Channel Wavelength Division Multiplexers and Bandpass Filters Based on Elliptical Bragg Reflectors", *Journal of Lightwave Technology*, vol. 8, No. 5, May 1990, pp. 748–755.

S. Valette, "State of the Art of Integrated Optics Technology at LETI for Achieving Passive Optical Components", *Journal of Modern Optics*, 1988, vol. 35, No. 6, pp. 993–1005.

M. Gibbon et al., "Optical Performance of Integrated 1.5 μm Grating Wavelength-Demultiplexer on InP-Based Waveguide", *Electronics Letters*, 12 Oct. 1989, vol. 25, No. 21, pp. 1441–1442.

M. C. Hutley, *Diffraction Gratings*, Academic Press, London, 1982, pp. 228–246.

Gustavsson et al., "Traveling Wave Semiconductor Laser Amplifier Detectors", *Journal of Lightwave Technology*, vol. 8, No. 4, Apr. 1990, pp. 610–617.

Mahlein, "Fiber-Optic Communication in the Wavelength-Division multiplex Mode", *Fiber and Integrated Optics*, vol. 4, No. 4, 1983, pp. 339–373.

Erman et al., "One Step Epitaxy Integration of GaInAs Monitor Photodiode and InP/GaInAsP/InP Rib Waveguides", *IOOC* 1989, Paper 20B1-18, pp. 74–75.

Cremer et al., "Grating Spectrograph in InGaAsP/InP for Dense Wavelength Division Multiplexing", *Applied Physics Letter*, vol. 59, No. 6, Aug. 1991, pp. 627–629.

Cremer et al., "Ingegriert Optischer Spektograph Für WDM Komponenten", *ITG Fachberichte Konferenz uber Heterostruktur-Bauelemente*, vol. 112, 27 Apr. 1990, pp. 125–130.

*Primary Examiner*—Brian Healy
*Attorney, Agent, or Firm*—Hill, Steadman & Simpson

[57] ABSTRACT

An integrated optical arrangement for multiplexing a plurality of different waveguide channels including a film waveguide disposed on a substrate having an arrangement for coupling a plurality of waveguide channels into the film waveguide, said film waveguide having a diffraction grating for separating the waveguide channels into a plurality of diffracted channels extending to a plurality of strip waveguides for conducting them from the film waveguide, and each of the strip waveguides having a photodetector in the form of an integrated diode for detecting the light being coupled from the film waveguide. The method includes providing a plurality of layers, removing the layers to form the diodes, further removing portions of the remaining layers to form the strip waveguides and film waveguides.

32 Claims, 5 Drawing Sheets

INTEGRATED OPTICAL ARRANGEMENT FOR DEMULTIPLEXING A PLURALITY OF DIFFERENT WAVELENGTH CHANNELS AND THE METHOD OF MANUFACTURE

BACKGROUND OF THE INVENTION

The present invention is directed to an integrated optical arrangement for demultiplexing a plurality of different wavelength channels and to the method of manufacturing the arrangement.

The transmission capacity of optical fibers can be significantly increased with optical wavelength multiplexing methods. Since optical wavelength multiplexing involves an optical multi-channel technique, the individual optical wavelength channels can be accessed in a simple way. A pre-condition for this technology, which is becoming widespread, however, are its reliability and, above all else, cost-beneficial transmission and reception modules.

A prior art for a channel spacing of approximately 5 nm comprises integrated optical arrangements for multiplexing a plurality of different wavelength channels with an optical diffraction grating that spectrally resolves the different wavelength channels that are fashioned in $SiO_2$. These are disclosed, for example, in a German Patent Application P 39 13 242.0 of C. Cremer and A. Reichelt entitled "Verfahren zur Herstellung eines an einem Schichtwellenleiter ausgebildeten Beugungsgitters". Also, see articles by C. H. Henry, R. F. Kazarinov, Y. Shani, R. C. Kistler, V. Pol, and K. J. Orlowsky entitled "Four-channel wavelength division multiplexers and bandpass filters based on elliptical Bragg reflectors" *Journal of Lightwave Technology*, Vol. 8, No. 5 May 1990, pp. 748–755; and S. Valette, "State of the art of integrated optics technology at LETI for achieving passive optical components", *Journal of Modern Optics*, Vol. 35, No. 6 (1988), pp. 993–1005. Such an arrangement in InGaAsP/InP which comprises a high order is known. For example, see an article by M. Gibbon, G. H. B. Thompson, S. J. Clements, D. J. Moule, C. B. Rogers, and C. G. Curaton entitled "Optical performance of integrated 1.5 μm grating wavelength-demultiplexer on InP-based waveguide", *Electronics Letters*, Vol. 25, No. 21, Oct. 12, 1989, pp. 1441–1442.

SUMMARY OF THE INVENTION

The object of the present invention is to provide an improved integrated optical arrangement for demultiplexing a plurality of different wavelength channels, which arrangement is easy to manufacture and is a compact integrated optical arrangement for demultiplexing a plurality of different optical wavelength channels with an optical diffraction grating which, in addition to spectrally resolving or separating the supplied optical wavelength channels, it can also simultaneously document the light of the spectrally resolved channels in optical detectors. In addition, the arrangement can be reliably made and made in a cost-beneficial manner.

To accomplish these goals, the present invention is directed to an improvement in an integrated optical arrangement for demultiplexing a plurality of different optical wavelength channels, which arrangement includes an optical layer waveguide being integrated on a substrate as a film waveguide and being limited by an edge with a portion of this edge having an optical diffraction grating formed thereon, the arrangement includes first means for coupling a plurality of different wavelength channels into the film waveguide at at least one infeed point, said plurality of different wavelength channels being conducted to the diffraction grating in the film waveguide, said diffraction grating spatially separating the plurality of different wavelength channels from one another by diffraction into different directions, said film waveguide guiding said plurality of different diffracted wavelength channels in different directions spatially separated from one another to another portion of the edge of the waveguide and second means for coupling out the plurality of waveguide channels at each of the outfeed points. The improvements are that the second means for coupling out include outfeed waveguides formed in a strip-like optical waveguide integrated on the substrate being coupled to each of the outfeed points, said outfeed waveguides guiding the wavelength channels coupled out from the film waveguide at said outfeed points to an optical detector, which is integrated on the substrate for each outfeed waveguide.

The improved device, thus, has an optical diffraction grating fashioned on an edge of a film waveguide formed on a substrate and additional optical components are integratable on the substrate individually or in combination with one another, but without having a negative influence on the compact nature of the arrangement and its technological manufacture. In addition to the easy manufacturing and compact integral optical arrangement for demultiplexing, the device includes demultiplexing a plurality of different optical waveguide channels with an optical diffraction grating that, in addition to spectrally resolving or separating the supplied optical wavelength channels, can also, simultaneously, document the light of the spectrally resolved channels in optical detectors. The advantages achieved with the invention are particularly those of reliability, cost-beneficial reception modules are possible wherein the optical demultiplexers are integrated on a common substrate together with optical detectors, whereby all wavelength channels can be received in parallel.

If the diffraction grating is constructed in the form of a focussing optical grating that focusses its refracted wavelength channels into the outfeed points, an additional advantage is provided in that the imaging elements, such as lenses or mirrors that effect an auxiliary attenuation and use area on the substrate, can be avoided. The provision of focussing gratings are disclosed, for example, in a book by M. C. Hutley entitled *Diffraction Gratings, Techniques of Physics*, edited by N. H. March, Academic Press 1982. Stigmatically focussing gratings offer the highest resolution (diffraction-limited).

If the means for coupling the light into the waveguide at the infeed point includes one or more infeed waveguides which extend side-by-side and are formed of strip-like optical waveguides integrated on the substrate, then an optically defined coupling of the arrangement to a supplying line fiber wherein the light of the supplied and infed wavelength channels emerges into the film waveguide with an optimally large divergency angle in order to illuminate an optimally large region of the diffraction grating and to thereby achieve a high resolution, can be obtained. The combination of a plurality of infeed waveguides conducted side-by-side offers the advantage that a shift of the spectrum at the optical detectors can be achieved, given infeed of light into a neighboring infeed channel and, by selecting a suitable outfeed waveguide, a desired central wavelength can, thus, be placed onto an optical detector.

It is also possible for the arrangement to include at least one optical amplifier which is integrated on the substrate for amplifying one or more wavelength channels which are being supplied to the optical detectors. This arrangement solves a problem based on improving the insertion attenuation and detection sensitivity of the integrated optical arrangement and/or of compensating losses of the diffraction grating of this arrangement.

An advantage of the arrangement with the integrated optical amplifier does not need any additional adjustment of the amplifier, the costs are reduced and no additional coupling losses occur between the arrangement and a fiber as a result thereof of the overall internal amplification of the optical semiconductor amplifiers of approximately 25 dB being available. The optical amplifier can be terminated at one side by a light-absorbent, optical detector, for example by a photodiode, as a result whereof back reflections of less than 0.1% can be achieved.

The optical amplifier can be fashioned to be in either an infeed waveguide or in an outfeed waveguide. The execution of the input waveguide as an optical amplifier offers the advantage that the amplifier noise is distributed by the following diffraction grating onto the optical detectors and is, thus, diminished per detector. The execution of an output waveguide as an optical amplifier, wherein the amplifier is thus arranged between the diffraction grating and the optical detector, offers the advantage that no additional cross-talk occurs between the wavelength channels, that an extremely high amplification is possible for every channel, and that the amplifier can be matched to the respective channel wavelength.

The optical amplifier of the integrated optical arrangement of the invention can be advantageously manufactured so that the amplifier of the infeed and outfeed waveguide is grown by selective epitaxy of a suitable film packet and is subsequently structured. The technological method of waveguide-amplifier integration corresponds to those of waveguide-laser integration and can be taken from that technology. Another advantageous possibility for manufacturing the optical amplifier is that the optical detector, for example a photodiode, is composed of the same film packet as the amplifier. No additional epitaxy for the amplifier is necessary given this possibility. The functioning of the optical amplifier that is employed as a detector is disclosed, for example, in an article by M. Gustavsson, A. Karlsson, and L. Thylén entitled "Traveling wave semiconductor laser amplifier detectors", *Journal of Lightwave Technology*, Vol. 8, No. 4, April 1990, pp. 610–617. It proceeds therefrom that these detectors are equal to pin photodiodes up to a data rate of 200 Mb/s.

It is desirable that the outfeed waveguides leading from each of the outfeed points to the different optical detectors diverge spatially from one another. This provides the advantage that spaces gained for the optical detector, particularly for their contacts, and that cross-talk that is given employment of electrical lines for divergency, occurs as high capacitative cross-talk at high bit rates is avoided.

There is a manufacturing-related advantage when each of the optical detectors is fashioned in the form of a photodiode that is optically coupled by a leakage wave coupling to the outfeed waveguides, which is associated with this diode.

To create an integrated optical arrangement for demultiplexing a plurality of different optical wavelength channels for bidirectional operation, it is desirable that the arrangement include one or more optical transmitters which are integrated on the substrate for generating individual optical wavelength channels, which individual wavelength channels can be coupled into the film waveguide at a different infeed point on the edge of the film waveguide and the individual wavelength channels coupled into the film waveguide are guided in the film waveguide to the diffraction grating wherein the diffraction grating deflects the individual waveguide channel in the direction toward the original or first infeed point of the first means so that the individual waveguide channel is deflected by the diffraction grating and guided by the film waveguide to the infeed point and can be coupled out from the film waveguide at this infeed point.

In bidirectional, optical multi-channel systems having wavelength-division multiplex transmissions, many wavelength channels are transmitted from a central station to a subscriber and one or more wavelength channels are transmitted from the subscriber to the central channel. A number of micro-optical arrangements having interference filters and diffraction gratings are known. Examples are disclosed in an article by H. F. Mahlein entitled "Fiber Optic communication in the wavelength-division multiplex mode", *Fiber and Integrated Optics*, Vol. No. 4, pp. 339–372 (1983) and these can be utilized for this purpose. These microscopic structures cannot be cost-beneficially manufactured and are absolutely indispensable for the subscriber terminal.

The arrangement with the bidirectional optical multi-channel system creates a cost-beneficial component that is cost-beneficially easy to manufacture and can be utilized for the subscriber terminal in a bidirectional optical multi-channel system having a wavelength-divisional multiplex transmission of many wavelength channels from the central station to the subscriber and of an individual wavelength channel or a plurality of wavelength channels from the subscriber back to the central station.

The one or more optical transmitters can be fashioned in the form of one or more semiconductor lasers and the diffraction grating can be constructed in the form of a focussing optical grating that will focus the wavelength channel or deflect the individual wavelength channels onto the original infeed point.

In constructing the arrangement of the present invention, the output waveguides can be constructed in the from of strip waveguides, the infeed waveguide can be constructed in the form of a rib waveguide, and each of the optical detectors may be constructed in a mesa-like elevated region on the substrate. These specific structures for the arrangement provide easier manufacturing of the arrangement.

Each of the above arrangements can be produced by providing on a substrate a layer packet composed of a plurality of layers, including an optical waveguiding layer, a cover layer covering the waveguiding layer, an absorption layer covering the cover layer, a contact layer covering the absorption layer, the contact layer, in specific regions, which will be subsequently the photodiodes, is provided with doping, which is opposite in comparison to any doping present in either the substrate or a layer interposed between the substrate and the optical waveguiding layer, the contact layer is provided with contacts in these local regions. Outside of these regions, the layer packet is then subjected to a treatment to remove the contact layer and absorption layer to expose a portion of the cover layer. This treatment will produce elevated regions with a projected mesa-like structure in the region where each of the photodiodes is to be positioned. Subsequent to removing the contact layer and the absorption layer, the cover layer and optical waveguiding layer are then processed to form a film waveguide having a diffraction grating in a portion of an edge and strip-like waveguides extending from the film waveguide to each of the mesa-shaped raised regions. Instead of providing a plurality of layers and then removing portions, it is also within the method of the present invention to provide the substrate with a waveguiding layer and the cover layer, then to remove the cover area in the areas of the local regions that are to be provided with the photodiode while retaining the cover layer in those regions outside of the local regions, providing an absorption layer at the local regions on the exposed waveguiding layer, providing a contact layer having a doping opposite in comparison to the doping present under the waveguiding layer on the absorption layer, providing contacts on the doped contact layer to form the photodiode, then shaping the waveguiding layer and cover layer in those areas outside of the photodiode to form the film waveguide having the diffraction grating and strip-like waveguides extending from the film-like waveguides to each of the photodiodes formed on the substrate.

Instead of the above procedures, it is also possible to provide a layer packet composed of the optical waveguiding layer, an absorption layer on the optical waveguide layer, a contact layer covering the absorption layer on the substrate, the contact layer and absorption layer are then moved down to the waveguiding layer region-by-region so that the absorption layer and contact layer only remain in those locations where photodiodes should be subsequently formed, then covering the exposed waveguiding layer with a cover layer, in those regions outside of the local regions, providing the contact layer with the desired doping opposite in comparison to the doping present under the waveguiding layer, providing contacts on the contact layer, then producing the film waveguide together with the diffraction grating and the strip-like waveguides, in those regions outside of the local region with the strip-like waveguides extending to each of the photodiodes, and the cover layer and waveguiding layer remain in each of the film waveguides and strip waveguides.

In each of the processes, in the region-by-region removal of the coupling layer and the waveguiding layer, the cover layer is covered with a first mask layer that covers the film in a pattern that defines the film waveguide together with the diffraction grating and the strip-like waveguides, the mask layer will also preferably define an infeed waveguide, this portion is covered with a second mask layer which will cover lateral regions along an infeed waveguide. The exposed portions of the cover layer and the waveguiding layer are then removed region-by-region so that only the cover layer and waveguiding layer remain in the places under the mask layers, then the second mask layer is removed and the cover layer is removed down to the waveguiding layer in the exposed portions created by the removal of the second mask layer and the cover layer only remains in those places covered by the first-mentioned layer.

All the recited methods are suitable for III-V of semiconductor materials and for epitaxial manufacture. The method according to the first above types requires only one epitaxy step for manufacturing the plurality of layers. The other two methods require two epitaxial steps, although the integrated optical arrangement having reduced polarization dispersion can be manufactured with these other to methods in a simple way.

The waveguide structures can be simultaneously manufactured in a simple way with the method of using the two masks. These will produce a strip waveguide means wherein the width of the strip-like waveguide is defined by the width of the waveguiding layer itself and a rib waveguide that has a width which is defined by the width of the cover layer that forms a rib on the waveguiding layer. The strip waveguide is intended to mean that the waveguide is longer than it is wide and the optical wave is essentially guided only in longitudinal direction along this waveguide.

Other advantages and features of the invention will be readily apparent from the following description of the preferred embodiments, the drawings and claims.

DESCRIPTION OF THE PREFERRED EMBODIMENTS

Figure 1:
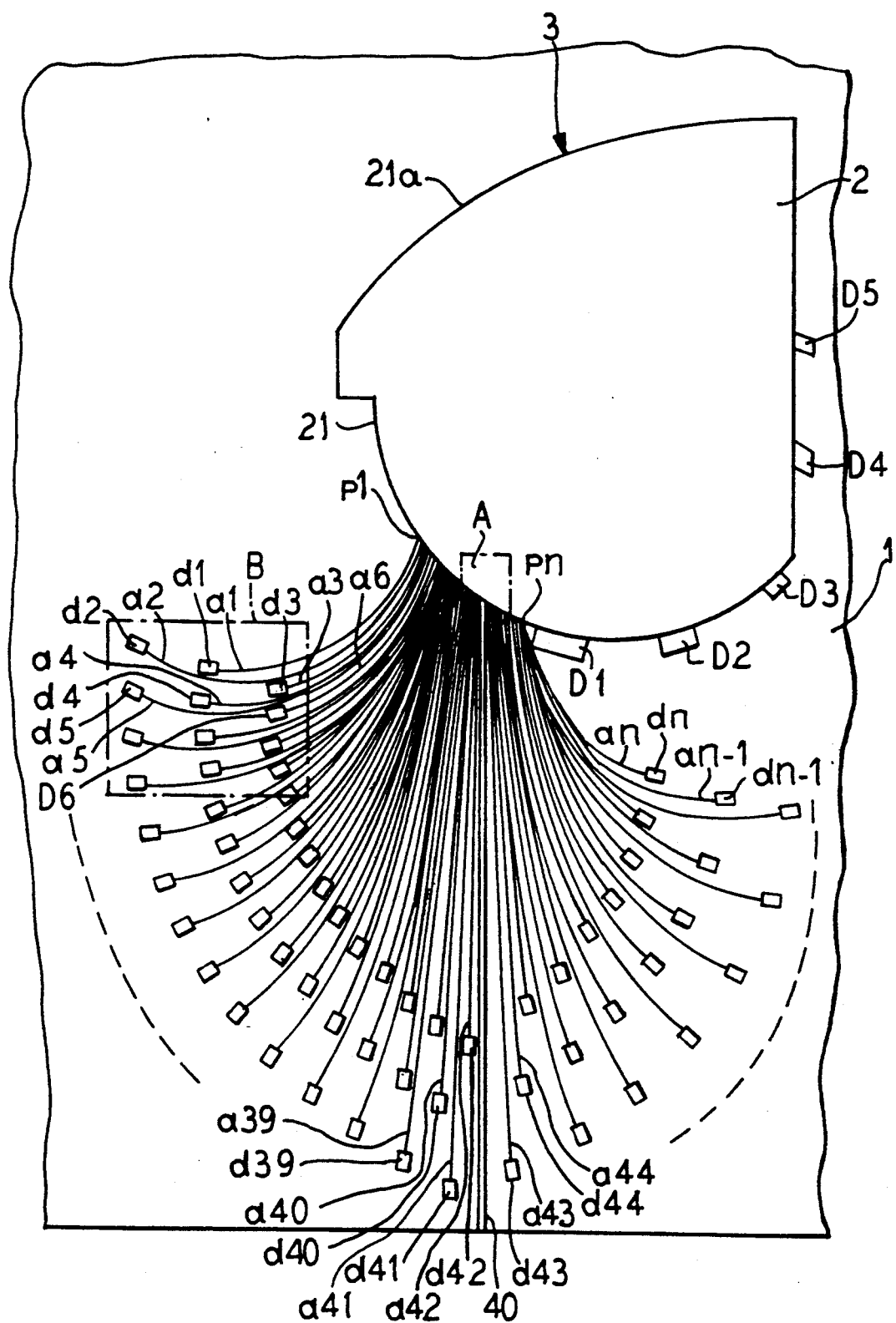
FIG. 1 is a plan view of a first exemplary embodiment of an integrated optical arrangement according to the present invention.
Figure 2:
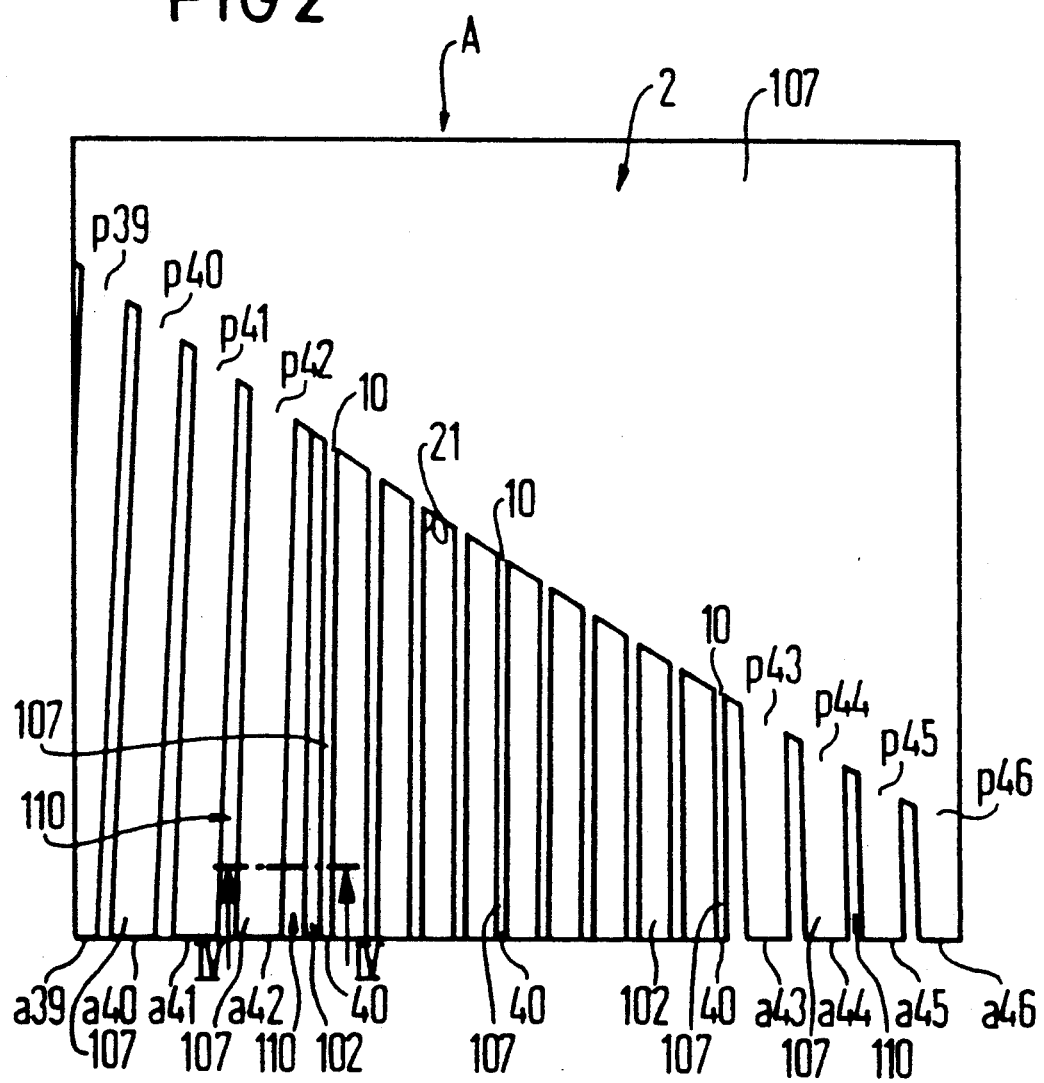
FIG. 2 is an enlarged plan view of the portion A bounded in broken lines from FIG. 1.
Figure 3:
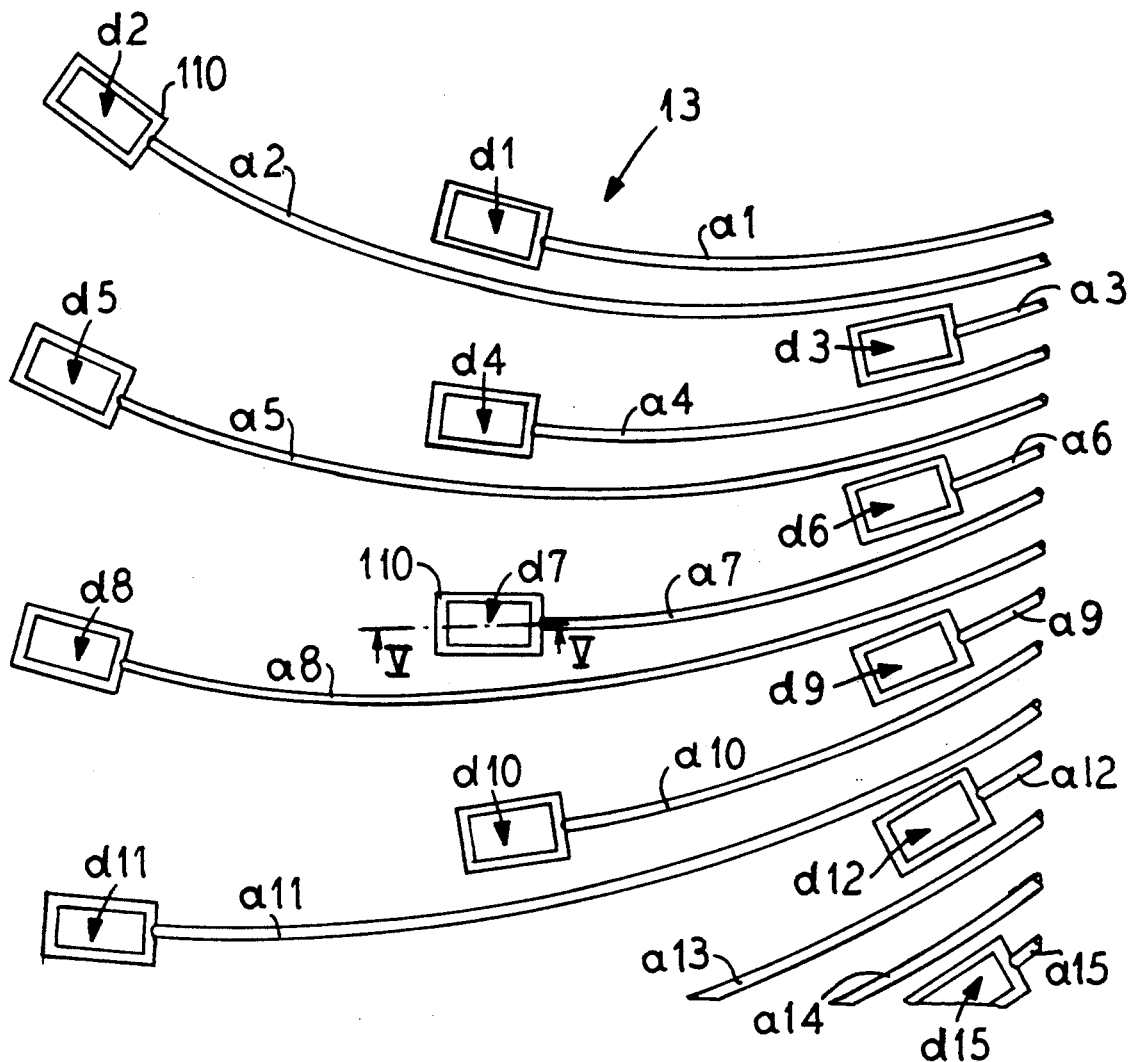
FIG. 3 is an enlarged plan view of the portion B bounded in broken lines from FIG. 1.
Figure 4:
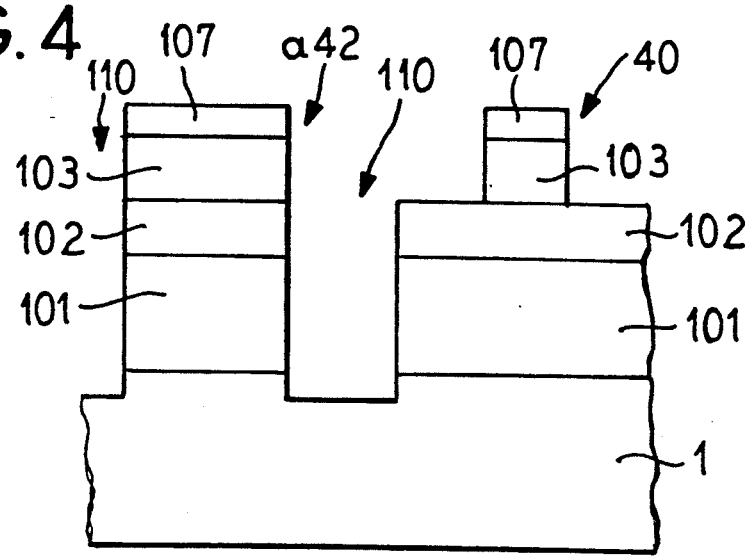
FIG. 4 is a cross sectional view taken along the lines IV—IV of FIG. 2.

The principles of the present invention are particularly useful when incorporated in the arrangement illustrated in FIG. 1. The arrangement of FIG. 1 includes a film waveguide 2 having a diffraction grating 3, a plurality of infeed waveguides 40, a plurality of outfeed waveguides $a_1$–$a_n$ and a plurality of optical detectors $d_1$–$d_n$, which are all integrated on a substrate 1. As illustrated in FIG. 2, which is a portion A of FIG. 1, ten input waveguides 40 extend side-by-side, each leading to a respective infeed point 10 at an edge 21 of the film waveguide 2. As illustrated in FIG. 4, the infeed waveguides 40 are executed in the form of rib waveguides and the outfeed waveguides $a_1$–$a_n$ are executed in the form of strip waveguides.

Every outfeed waveguide $a_1$–$a_n$ leads from an outfeed point $p_1$–$p_n$ allocated to it and extends to an optical detector $d_1$–$d_n$, which is allocated to the particular outfeed waveguide.

Figure 7:
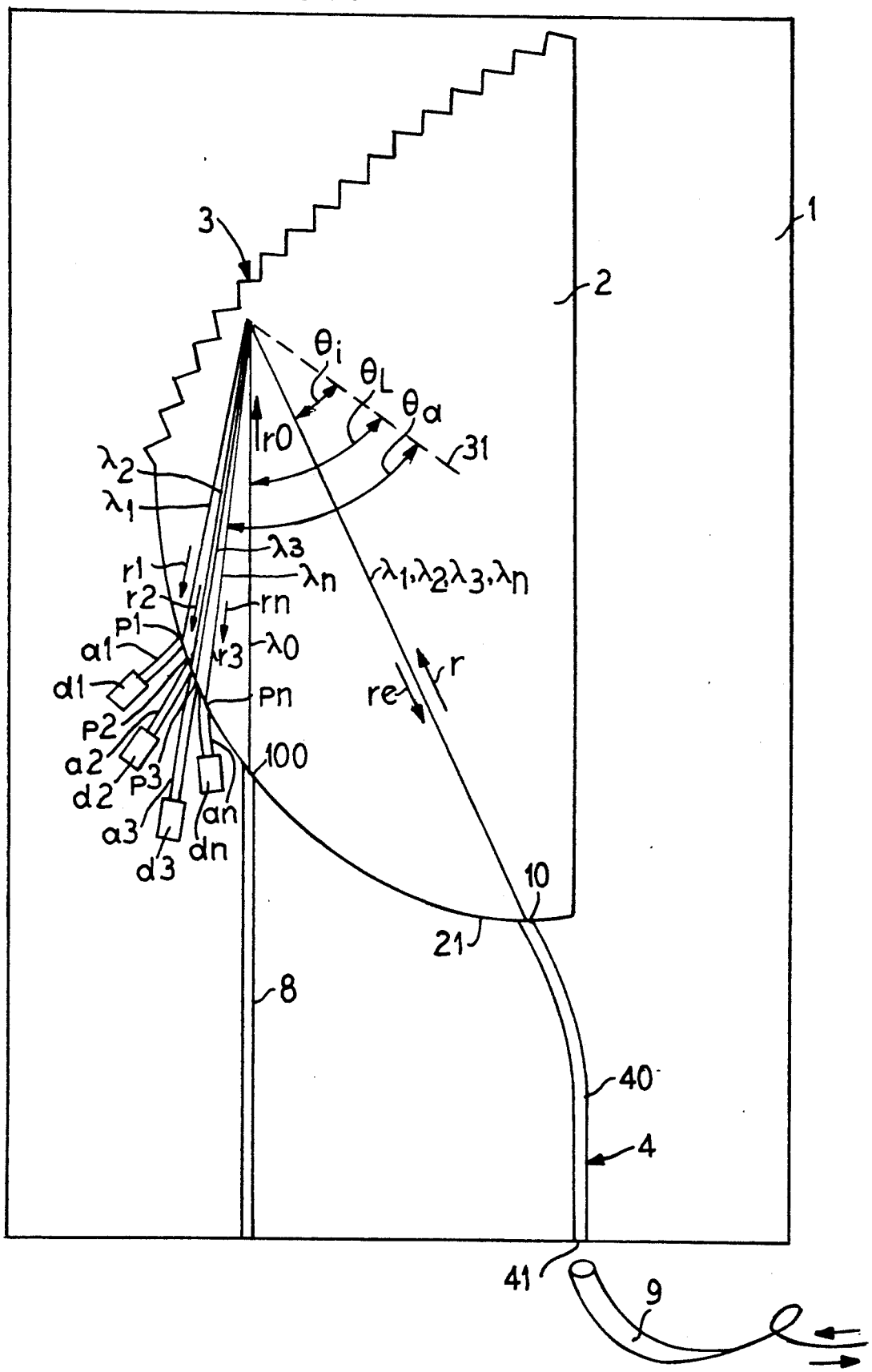
FIG. 7 is a plan view of an embodiment of the integrated optical arrangement of the present invention, which is capable of bidirectional operation.

In the Figures, n means an arbitrary, natural number. In the case of the wavelength channels $\lambda_1$–$\lambda_n$, n denotes the number of these channels to be multiplexed. In FIGS. 1 and 7, n denotes the plurality of optical detectors and the number of outfeed waveguides. In order to be able to demultiplex n wavelength channels, at least n optical detectors must be present. In FIG. 1, n=63 outfeed waveguides and n=63 optical detectors that are connected to the outfeed waveguides and are integrated on the substrate 1.

The waveguide channels $\lambda_1-\lambda_n$, which are to be multiplexed, are coupled into an infeed waveguide 40 and are conducted to the allocated infeed point 10, at which the channels are coupled into the film waveguide 2. In the film waveguide 2, the wavelength channels $\lambda_1-\lambda_n$ are conducted to a diffraction grating that is fashioned on an edge 21a of the waveguide 2, which portion is illustrated in FIG. 1 as being adjacent the edge 21. A grating 3 is preferably a focussing grating, wherein the appertaining edge 21a proceeds sawtooth-like along a curved line, as illustrated in FIG. 7 in an exaggerated form.

The grating spectrally resolves the supplied wavelength channels $\lambda_1-\lambda_n$. The channels $\lambda_1-\lambda_n$ spectrally resolved by the grating are guided by the film waveguide 2 in the direction toward the outfeed waveguides a1-an at the edge 21 of the film waveguide 2. The focussing grating 3 causes every wavelength channel to be focussed into an allocated outfeed point on the edge 21 of the film waveguide 2. The outfeed waveguides coupled at this outfeed point act like an exit gap in a spectroscope and correspond to the wavelength channel. The width of the outfeed waveguide or, respectively, the spacing of the outfeed waveguide define the channel width and/or, respectively, the channel spacing.

Every outfeed waveguide a1-an conducts the wavelength channel, which is coupled into it, to an optical detector, which is connected to the channel. The optical detector will detect the wavelength channel in the particular outfeed waveguide.

A method for manufacturing the exemplary embodiment of FIG. 1 is as follows:

A packet of layers (see FIGS. 4 and 5) is applied onto a substrate 1, which is InP. This packet will be composed of a buffer layer 101 of InP that is directly applied on the substrate 1, but is not always necessary. The packet will then also include a waveguiding layer 102 of InGaAsP, which is applied on the buffer layer 101, a cover layer 103 of InP, which is applied on the waveguiding layer 102, an absorption layer 104 (see FIG. 5) of InGaAs, which is applied on the cover layer 103, and a contact layer 105 of InP, which is applied on the absorption layer 104. A passivating layer 106, for example of $SiN_x$, that can be produced with a CVD method is applied onto the contact layer 105.

Figure 5:
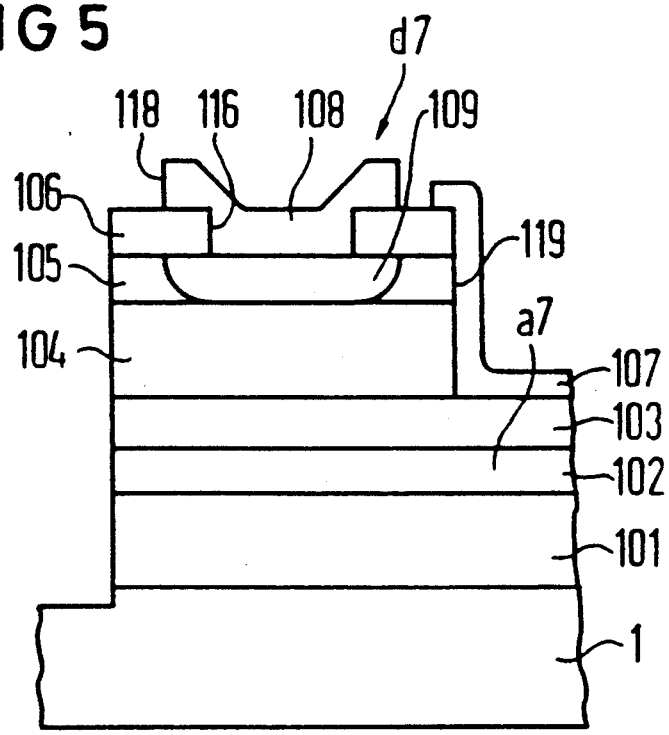
FIG. 5 is a partial cross sectional view taken along the lines V—V of FIG. 3.
Figure 6:
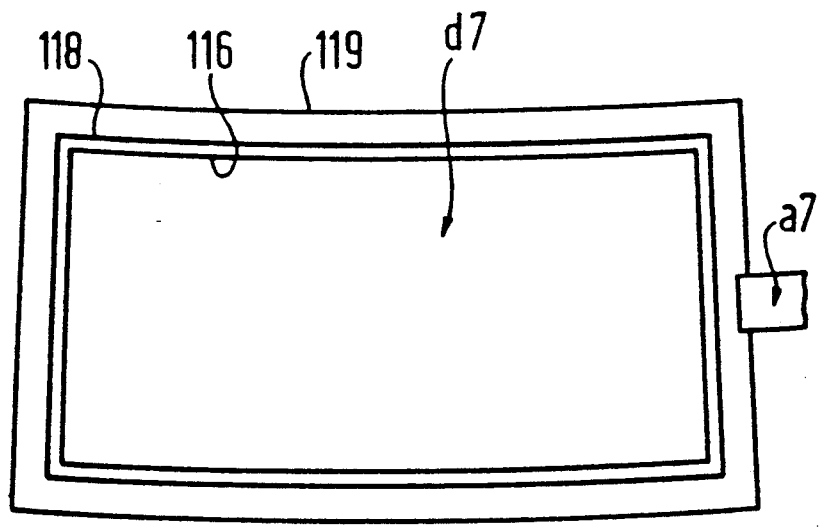
FIG. 6 is an enlarged plan view of the optical detector illustrated in FIG. 3.

As illustrated in FIG. 5, a local doping 109 is undertaken in a first structure level at a local region provided for the optical detectors in the form of diodes. This local doping 109 is a p-doping given an n-doped substrate and is an n-doping if the substrate 1 is a p-doped substrate. The doping can occur by either a diffusion or an ion implantation. The first structure layer can be eliminated when the contact layer 105 is already produced doped during the epitaxy. This will lead to a simpler structure, but also leads to stability problems of the photodiodes, since the pin-junction is exposed at the heterojunction at the side wall of the mesa-shaped, raised region 119 produced by this method.

The doped contact layer 105 is contacted in the local regions in a second method step. For example, contact paths 108 of TiPtAu are structured. This can be done, for example, by a known lift-off technique and the contact layer 105 is then contacted through an opening 116, which was formed in the passivating layer 106.

In a third method or construction step, mesa-shaped, raised regions 119 are produced by etching down to the cover layer 103 with the assistance of the passivating layer 106 acting as a mask. For example, this etching can be undertaken by a reactive ion etching (RIE), for example with a $CH_4/H_2$ gaseous material.

The film waveguide 2 and the grating 3, as well as the input waveguides 40 and the output waveguides a1-an, are formed in the waveguiding layer 102, which is the fifth structural level counting from the passivating layer 106 down toward the substrate. The formation of these waveguiding layers is accomplished by forming a mask layer 107. The mask layer 107 can be the passivating layer that remains on the arrangement. For example, the mask layer 107 can be composed of $SiN_x$ that is applied with a CVD method. The structure of the mask layer 107 is shown in the plan view of FIG. 2.

Before etching, utilizing the mask layer 107, this layer 107 is covered in a selected region corresponding to the infeed waveguides 40 by a second mask layer, which is not shown, that will cover the regions of the cover layer 103 lying adjacent the strips of mask layer 107 that are assigned to each waveguide 40. The second mask layer, for example, can be composed of a photoresist. Subsequent to applying the second mask layer, an etching down into a depth lying between the waveguiding layer 102 and substrate is undertaken in the regions free of the mask layer 107 and the second mask layer. A reaction ion etching with $CH_4/H_2$ is also suitable for performing this etching. After this etching step, the second mask layer is removed, for example by incineration with $O_2$, and the infeed waveguides 40 are etched as rib waveguides by etching the exposed lateral regions of the cover layer 103. This can also be undertaken utilizing the reactive ion etching using $CH_4/H_2$. In this step, the remaining waveguide 2 and the waveguides a1-an, as well as the diffraction grating 3, are also etched more deeply.

Finally, in the sixth or last structure, the etched end faces of the diffraction grating 3 are vapor-deposited with a metal in order to increase the diffraction efficiency of the grating. Instead of vapor depositing, they can be sputtered with the metal coating. This can occur with a known lift-off technique.

In the exemplary manufacturing method, the layer packet is dimensioned so that it can be manufactured together with the photodiode in one epitaxy. The gap wavelength of the material of the waveguiding layer that amounts to 105 $\mu$m keeps the polarization dispersion low.

In an arrangement manufactured according to the exemplary method, the buffered layer 101 has a thickness of more than 2 $\mu$m, the waveguiding layer 102 has a gap wavelength of 1.05 $\mu$m and a thickness of 0.5 $\mu$m. The thickness of the cover layer 103 amounts to 0.2 $\mu$m, while the thickness of the absorption layer 104 amounts to 1 $\mu$m and the thickness of the contact layer 105 amounts to 0.5 $\mu$m. All of these layers can be applied in an epitaxial step.

The substrate 1 of InP can be n-doped or can be semi-insulating in order to achieve better HF properties. Given employment of the semi-insulating substrate 1, n-doping is carried out in the lower half of the buffer zone 101 in order to enable a low impedance terminal or connection of the n-region of the photodiodes. Moreover, additional structural steps are required in order to define the n-contact and in order to pull the p-contacts out into the semi-insulating substrate. The version having the n-doped substrate 1 is technologically simpler.

Given a rib height of 0.2 $\mu$m, the width of the single-mode infeed waveguide 40 is selected so that the light emerges at the infeed point 10 with an optimally great divergency angle of, for example, $\pm 10°$ in order to illuminate an optimum plurality of grating teeth, this being equivalent to a high resolution. When coupling light into the neighboring infeed waveguides 40, a shift of the spectrum at the photodiodes d1-dn can be achieved and a desired central wavelength can be placed onto the diodes in this way by selecting a suitable infeed waveguide 40.

A curved diffraction grating 3 is dimensioned so that, with a given resolution of the lithographic method, it enables an optimally large dispersion in an optimally low order of the arrangement. The portion of the edge 21 of the film waveguide 2 on which the outfeed points p1-pn lie is a circular arc that corresponds to a "Rowland circle" for the grating 3.

The spacing of the outfeed waveguide is selected at approximately 10 $\mu$m for a channel spacing of 4 nm. The width of the outfeed waveguide at 9 $\mu$m is selected as large as possible.

The outfeed waveguides a1-an are conducted apart on a circular arc having a radius of more than 1 mm until a spacing of these waveguides is so large that bond pads having an area of $50 \times 100$ $\mu m^2$ have a space on the photodiodes. Given employment of semi-insulating substrates, the photodiodes can be executed narrower, since the bond pads no longer lie on the photodiode itself. The required spacing of the outfeed waveguides from one another in this case occurs from the guidance of the interconnects from the p-contacts to the bond pads and from their position on the substrate. The pads can be wired with wedge bonding.

The photodiodes d1-dn are arranged in three rows lying behind one another in order, first, to save space and in order, simultaneously, to guarantee an optimally great spacing of the pads with which electrical crosstalk is suppressed.

In the example, the minimally resolvable grating period amounts to 1.6 $\mu$m. Given this resolution, a dispersion of 1 mrad/nm in the fourth order of the arrangement is enabled. The light that is diffracted by the diffraction grating 3 in the fourth order into the zero, first, second and third order is likewise focussed in the proximity of the Rowland circle. This light can be detected by photodetectors D1-D5 (see FIG. 1).

The photodetectors D1-D5 can be manufactured like the photodiodes d1-dn and receive a reference signal that corresponds to the sum of the received channels. The intensity of the signals provides information about the diffraction efficiency of the grating 3 into the individual orders.

The width of the photodiodes d1-dn is defined by the size of the bond pad when this lies on the diode itself. Otherwise, they have a minimum width of approximately 15 $\mu$m.

The polarization dispersion can be reduced by a thicker cover layer 103 having a thickness from approximately 1 $\mu$m to approximately 0.5 nm. A further reduction in the dispersion can be achieved by a subsequent coating of this cover layer with metal (see U.S. Pat. No. 5,077,822, which claims priority from German Application P 39 31 705.6).

In order to be able to employ a dispersion-reducing, thick cover layer 103 and to, nonetheless, obtain a good efficiency of the photodiodes d1-dn, the above-recited example of the manufacturing method can be modified so that a separate layer packet for the waveguides 2, a1-an and 40 and a separate layer packet for the photodiodes d1-dn are grown in a double epitaxy.

In the first epitaxy step, the buffer layer 101, the waveguiding layer 102 and the cover layer 103 having a thickness of 1 $\mu$m are grown on the substrate. The cover layer 103 is then masked with a mask layer in all regions where the waveguides 2, the waveguides a1-an and the waveguides 40 are to be located. The thick cover layer 103 of InP is then removed down to the waveguiding layer 102 in all portions not protected by the mask by a selective etching, for example using HCL.

In a second epitaxy step, a layer packet for the photodiodes is then selectively grown onto the exposed waveguiding layer 102. This layer packet is composed of an absorption layer 104 of InGaAs having a thickness of 1 $\mu$m and a contact layer 105 of InP having a thickness of 0.5 $\mu$m.

The two epitaxy steps can also be implemented in the reverse sequence, dependent on which sequence proves technologically more beneficial. The horizontal structuring, as in the first-recited method example, is then undertaken, whereby one begins with the first structure level.

The spectral range of the arrangement manufactured by the above manufacturing examples lies at 1.3 $\mu$m-1.6 $\mu$m. Given a channel spacing of 4 nm, up to 100 channels are available. As a result of the monolithic integration of the demultiplexers and photodiodes, involved and sensitive adjustments are eliminated in this arrangement, which is therefore suitable as a receiver module for DWDM systems.

The arrangement of the invention, which is schematically illustrated in FIG. 7, is suitable for a bidirectional operation and differs from the arrangement of FIG. 1 essentially on the basis of one or more additional optical transmitters 8. In FIG. 7, for simplicity, only one transmitter 8 is illustrated and n=4.

The arrangement of FIG. 7 can be utilized for a bidirectional sub-system at the subscriber. The arrangement transmits one or more wavelengths and receives and demultiplexes a plurality of wavelength channels so that the transmission and reception wavelengths lie relatively far apart. For example, the transmitter 8 transmits at a wavelength $\lambda_0$ in a region about 1.5 $\mu$m and the receiver will receive a range of from 1.25 $\mu$m to 1.38 $\mu$m given a channel spacing $\Delta\lambda$ of 4 nm.

The light supplied by the receiver via a line fiber 9 is conducted from the infeed waveguide 40 fashioned as an optical amplifier 4 to the infeed point 10 on the edge 21 of the film waveguide and is coupled into the film waveguide 2 at the infeed point 10. In the film waveguide 2, the light laterally freely propagates in the direction r with an aperture angle corresponding to the width of the infeed waveguide 40 and impinges the diffraction grating 3 by which the light is focussed onto the outfeed points p1-pn.

As in the exemplary embodiment of FIG. 1, the outfeed waveguides a1-an freely coupled to the film waveguide 2 at the outfeed points p1-pn conduct the various wavelength channels $\lambda_1$-$\lambda_n$ to the photodiodes d1-dn. These photodiodes d1-dn are expediently manufactured of InGaAsP having a gate wavelength of approximately 1.4 $\mu$m so that the light of the wavelength channels in the range of 1.28 $\mu$m-1.38 $\mu$m will be absorbed, but the light of the optical transmitters 8 in the wavelength range of around 1.5 μm is transmitted and, thus, is not converted into a photocurrent.

With respect to the optical transmitter 8, preferably constructed in the form of a semiconductor laser, the diffraction grating is in Littrow arrangement having a Littrow wavelength. The semiconductor lasers of the respective transmission channel are executed with an active layer for a wavelength of approximately 1.53 μm. The optical resonators are limited at the one side by an end face or by an etched mirror and are limited at the other side by the grating that represents a partially transmissive mirror for the light of the transmission wavelength. Another order of the diffraction grating 3 focusses the light of the transmission wavelength in the direction re to the infeed point 10, where this light is coupled into the infeed waveguide 40.

In order to compensate manufacturing tolerances, a plurality of lasers 8 can be arranged side-by-side similar to the infeed waveguides of FIG. 1 so that the emission wavelength of the laser lies at the Littrow wavelength of the diffraction grating 3 in all cases.

In order to enhance the detection sensitivity of the arrangement of FIG. 7 and in order to compensate the losses of the diffraction grating 3, the infeed waveguide 40 is executed as an optical amplifier 4 for the wavelength range around 1.3 μm.

Also in order to enhance the detection sensitivity, the end face 41 of the infeed waveguide 40 is anti-reflection coated for the wavelength range from 1.28 μm through 1.38 μm. The efficiency of the laser can be increased when the anti-reflection layer at this end face 41 acts as a mirror for wavelengths of 1.53 μm. For example, such an end face coating is composed of two layers of different thicknesses that have different diffraction.

In a non-limiting exemplary embodiment of the diffraction grating 3, the grating is dimensioned in the following way. The grating period amounts to 1.5 μm, the angle $\Theta_L$ between the emission direction $r_0$ and a grating normal 31 amounts to 52.36° in the fifth diffraction order (no Bragg angle). The fourth order for the light of the waveguide 1.53 μm is then emitted by the grating 3 in the direction re to the infeed point 10 that describes an angle $\Theta_i$ of 28.36° with the grating normal 31. This denotes the nearly Bragg angle.

The light of the wavelength 1.3 μm coupled into the film waveguide 2 at the infeed point 10 impinges the grating 3 in a direction r that describes the same angle $\Theta_i$ of 28.36° with the grating normal 31. This light is beamed out in the fifth order in a principal direction to the outfeed points p1–pn that describes an angle $\Theta_a$ of 60.54° (Bragg angle) with the grating normal 31. The light of the wavelength 1.3 μm is beamed out in the fourth order at an angle of approximately 37° having a significantly lower diffraction efficiency (no Bragg angle).

The grating receives a Bragg or blaze angle so that the coupling of the light having the wavelength around 1.3 μm from the infeed waveguide 40 into the diodes d1–dn is optimized. For that purpose, the surface of the grating teeth generating the blaze is set at an angle of 44.45° vis-a-vis the grating normal 31.

Although various minor modifications may be suggested by those versed in the art, it should be understood that we wish to embody within the scope of the patent granted hereon all such modifications as reasonably and properly come within the scope of our contribution to the art.

We claim:

1. In an integrated optical arrangement for demultiplexing a plurality of different optical wavelength channels, said arrangement including an optical layer waveguide being integrated on a substrate as a film waveguide and being limited by an edge with a portion of said edge having an optical diffraction grating formed thereon, said arrangement including first means for coupling a plurality of different wavelength channels into the film waveguide at an infeed point, said plurality of different wavelength channels being conducted to the diffraction grating by the film waveguide, said diffraction grating spatially separating the plurality of different wavelength channels from one another by diffraction into different directions, said film waveguide guiding said plurality of different diffracted wavelength channels in different directions spatially separated from one another to another portion of the edge of the film waveguide and second means for coupling out a plurality of the waveguide channels at each of the output points, the improvements comprising the second means for coupling being strip-like optical outfeed waveguides integrated on the substrate and being coupled to each of the outfeed points, said outfeed waveguide guiding the wavelength of the channels coupled out from the film waveguide at said output points to an optical detector which is integrated on the substrate for each outfeed waveguide, and said first means for coupling including a plurality of infeed waveguides extending side-by-side in the form of strip-like waveguides which are integrated on the substrate.

2. In an integrated optical arrangement according to claim 1, wherein the diffraction grating is in the form of a focussing optical grating which focusses the diffracted wavelength channels onto the outfeed points.

3. In an integrated optical arrangement for demultiplexing a plurality of different optical wavelength channels, said arrangement including an optical layer waveguide being integrated on a substrate as a film waveguide and being limited by an edge with a portion of said edge having an optical diffraction grating formed thereon, said arrangement including first means for coupling a plurality of different wavelength channels into the film waveguide at an infeed point, said plurality of different wavelength channels being conducted to the diffraction grating by the film waveguide, said diffraction grating spatially separating the plurality of different wavelength channels from one another by diffraction into different directions, said film waveguide guiding said plurality of different diffracted wavelength channels in different directions spatially separated from one another to another portion of the edge of the film waveguide and second means for coupling out a plurality of the waveguide channels at each of the output points, the improvements comprising the second means for coupling being strip-like optical outfeed waveguides integrated on the substrate and being coupled to each of the outfeed points, said outfeed waveguide guiding the wavelength of the channels coupled out from the film waveguide at said output points to an optical detector which is integrated on the substrate for each outfeed waveguide, and amplifier means for optically amplifying a wavelength channel prior to being supplied to an optical detector integrated on said substrate.

4. In an integrated optical arrangement according to claim 3, wherein said first means for coupling a plurality of different wavelength channels includes an infeed waveguide integrated on said substrate.

5. In an integrated optical arrangement according to claim 3, wherein the first means for coupling includes a plurality of infeed waveguides extending side-by-side in the form of strip-like waveguides which are integrated on the substrate.

6. In an integrated optical arrangement according to claim 1, which includes an amplifier means for optically amplifying a wavelength channel prior to being supplied to an optical detector being integrated on said substrate.

7. In an integrated optical arrangement according to claim 6, wherein the amplifier means is provided on an infeed waveguide of the first means.

8. In an integrated optical arrangement according to claim 6, wherein amplifier means is formed on each outfeed waveguide.

9. In an integrated optical arrangement according to claim 1, wherein each of the outfeed waveguides extending from its outfeed point diverges spatially from one another.

10. In an integrated optical arrangement according to claim 1, wherein each of the optical detectors is constructed in the form of a photodiode that is optically coupled by a leakage wave coupling to its respective outfeed waveguide which extends to said diode.

11. In an integrated optical arrangement according to claim 1, which includes optical transmitter means being integrated on a substrate for generating individual optical wavelength channels, said optical transmitter means being coupled to the film waveguide at a second infeed point on the edge of the film waveguide, said individual wavelength channels coupled into said film waveguide being guided in the film waveguide to the diffraction grating, wherein the diffraction grating deflects the individual wavelength channel in the direction toward the first-mentioned infeed point and wherein the individual wavelength channel deflected by the diffraction grating is guided by the film waveguide to the first infeed point and is coupled out from the film waveguide into the first means for coupling in a direction extending opposite to the different wavelength channels being provided by said first means.

12. In an integrated optical arrangement according to claim 11, wherein the optical transmitter is in the form of a semiconductor laser.

13. In an integrated optical arrangement according to claim 11, wherein the diffraction grating is constructed in the form of a focussing optical grating for focussing the deflected individual wavelength channel onto a single point.

14. In an integrated optical arrangement according to claim 1, wherein each of the output waveguides is constructed in the form of a strip waveguide.

15. In an integrated optical arrangement according to claim 3, wherein the first means for coupling is formed by a rib waveguide integrated on the substrate.

16. In an integrated optical arrangement according to claim 1, wherein each of the optical detectors is constructed as a mesa-like, elevated region on the substrate.

17. A method for manufacturing an integrated optical arrangement for demultiplexing a plurality of different optical wavelength channels, said arrangement including an optical layer waveguide being integrated on a substrate as a film waveguide having an edge with a portion being an optical diffraction grating, first means for coupling a plurality of different wavelength channels at an infeed point into the film waveguide, which conducts the wavelength channels to the diffraction grating which spatially separates the plurality of different wavelength channels into individual diffracted waveguide channels that are directed and conducted to a plurality of output points on another portion of the edge of the film waveguide, second means for coupling out each of the diffracted waveguide channels at each of the output points including outfeed waveguides formed in a strip-like optical waveguide integrated on the substrate, said outfeed waveguides guiding the waveguide channels coupled out from said film waveguide at said outfeed points to an optical detector which is integrated on the substrate as a photodiode for each of the outfeed waveguides, said method comprising the steps of providing a packet of layers on a substrate, said packet including an optical waveguiding layer, a cover layer disposed on the waveguiding layer, an absorption layer disposed on the cover layer, and a contact layer disposed on the absorption layer, said contact layer having at least a local region disposed at each location for each photodiode with a doping opposite in comparison to a doping present immediately under the waveguiding layer, providing contacts for said contact layer at said local region, reducing the packet of layers in a region outside of each of the local regions by removing the contact layer and absorption layer in the outside region, and producing a film waveguide having a diffraction grating and strip-like waveguides extending to each of the mesa-shaped raised regions by a region-by-region removal of said cover layer and waveguiding layer so that the waveguiding layer and the cover layer remain at a location for the film waveguide and strip-like waveguides.

18. A method according to claim 17, wherein the step of providing contacts is accomplished before the step of reducing the packet layers and said step of reducing the packet layers forms elevated regions in the mesa-like form extending above the cover layer from the contact layer and the absorption layer remaining at each of the local regions to define photodiodes coupled by a leakage wave coupling to a waveguide layer thereberneath.

19. A method according to claim 17, wherein the step of producing a film waveguide having a diffraction grating and strip-like waveguides includes providing a first mask layer on the exposed cover layer to cover portions to form the film waveguide together with the diffraction grating, the strip waveguides and a portion to form a first strip designed as an input waveguide of the first means, providing a second mask layer on the cover layer adjacent the first strip formed by the first mask layer, then removing exposed portions of the cover layer and some of the waveguiding layer thereberneath by an etching process, removing the second mask layer and subsequently removing exposed portions of the cover layer to form the strip-like waveguides extending to each of the detectors and a rib waveguide for the first means.

20. A method according to claim 17, wherein the step of reducing the packet layers is accomplished before the step of providing contacts on the contact layer.

21. A method for manufacturing an integrated optical arrangement for demultiplexing a plurality of different optical waveguide channels, said arrangement including an optical layer waveguide being integrated on a substrate as a film waveguide having an optical diffraction grating formed on a portion of an edge thereof, first means for coupling a plurality of different wavelength channels at an infeed point into the film waveguide to be conducted to the diffraction grating which separates them into a plurality of individual diffracted wavelength channels extending in different direction toward a plurality of outfeed points along the edge space to receive each of the individual diffracted wavelength channels, second means for coupling out each of the diffracted wavelength channels into strip-like optical waveguides integrated on the substrate, each of said waveguides extending to an individual optical detector means for detecting the channel being carried therein, said method comprising the steps of providing a packet of layers on a substrate, said packet being composed of at least a waveguiding layer and a cover layer resting on said waveguiding layer, removing the cover layer in local regions which will subsequently be photodiode regions of each of the detector means to expose the waveguiding layer with the cover layer remaining in those regions outside of said local regions, providing an absorption layer at each of said local regions on the exposed waveguiding layer, providing a contact layer having a doping opposite in comparison to the doping present immediately under the waveguide layer on the absorption layer, providing contacts in the local region on the doped contact layer, and then forming a film waveguide with the diffraction grating and strip-like waveguides in the region outside of the local region by removing a portion of the cover layer and the waveguiding layer so that the waveguiding layer and the cover layer remain in place in an area formed of said film waveguide and outfeed waveguides.

22. A method according to claim 21, wherein the step of forming the film waveguide with the diffraction grating and the strip waveguides comprises forming a first mask layer of a desired pattern on the exposed cover layer, said first layer covering the regions of the covered layer which are to be formed into the film waveguide and the strip-like waveguides and including a first strip for forming an incoming waveguide of the first means, providing a second mask layer covering portions of the exposed cover layer adjacent said first strip, etching the exposed portions of the cover layer to remove those exposed portions, removing the second mask layer and etching a second time to remove exposed portions of the cover layer and to remove exposed portions of the waveguiding layer down to said substrate to complete the formation of the strip waveguides of the second means, the film waveguide and a rib waveguide for the incoming waveguide.

23. In an integrated optical arrangement according to claim 3, wherein the diffraction grating is in the form of a focussing optical grating which focusses the diffracted wavelength channels onto the outfeed points.

24. In an integrated optical arrangement according to claim 3, wherein the amplifier means is provided on an infeed waveguide of the first means.

25. In an integrated optical arrangement according to claim 3, wherein amplifier means is formed on each outfeed waveguide.

26. In an integrated optical arrangement according to claim 3, wherein each of the outfeed waveguides extending from its outfeed point diverges spatially from one another.

27. In an integrated optical arrangement according to claim 3, wherein each of the optical detectors is constructed in the form of a photodiode that is optically coupled by a leakage wave coupling to its respective outfeed waveguide which extends to said diode.

28. In an integrated optical arrangement according to claim 3, which includes optical transmitter means being integrated on a substrate for generating individual optical wavelength channels, said optical transmitter means being coupled to the film waveguide at a second infeed point on the edge of the film waveguide, said individual wavelength channels coupled into said film waveguide being guided in the film waveguide to the diffraction grating, wherein the diffraction grating deflects the individual wavelength channel in the direction toward the first-mentioned infeed point and wherein the individual wavelength channel deflected by the diffraction grating is guided by the film waveguide to the first infeed point and is coupled out from the film waveguide into the first means for coupling in a direction extending opposite to the different wavelength channels being provided by said first means.

29. In an integrated optical arrangement according to claim 28, wherein the optical transmitter is in the form of a semiconductor laser.

30. In an integrated optical arrangement according to claim 28, wherein the diffraction grating is constructed in the form of a focussing optical grating for focussing the deflected individual wavelength channel onto a single point.

31. In an integrated optical arrangement according to claim 3, wherein each of the output waveguides is constructed in the form of a strip waveguide.

32. In an integrated optical arrangement according to claim 22, wherein each of the optical detectors is constructed as a mesa-like elevated region on the substrate.

* * * * *